United States Patent
Kamikawa et al.

(10) Patent No.: US 7,637,029 B2
(45) Date of Patent: Dec. 29, 2009

(54) VAPOR DRYING METHOD, APPARATUS AND RECORDING MEDIUM FOR USE IN THE METHOD

(75) Inventors: Yuji Kamikawa, Tosu (JP); Kazuhiko Kobayashi, Tosu (JP); Nobutaka Kuroda, Tosu (JP); Mikio Nakashima, Tosu (JP); Osamu Tsuda, Tosu (JP)

(73) Assignee: Tokyo Electron Limited, Tokyo-to (JP)

( * ) Notice: Subject to any disclaimer, the term of this patent is extended or adjusted under 35 U.S.C. 154(b) by 241 days.

(21) Appl. No.: 11/472,415

(22) Filed: Jun. 22, 2006

(65) Prior Publication Data

US 2007/0006483 A1  Jan. 11, 2007

(30) Foreign Application Priority Data

Jul. 8, 2005 (JP) ............................. 2005-199898
Aug. 10, 2005 (JP) ............................. 2005-231828

(51) Int. Cl.
*F26B 19/00* (2006.01)

(52) U.S. Cl. ................................ 34/78; 34/90; 134/902; 216/59

(58) Field of Classification Search .................. 34/351, 34/77, 78, 80, 90; 134/902; 216/59
See application file for complete search history.

(56) References Cited

U.S. PATENT DOCUMENTS

| | | | | |
|---|---|---|---|---|
| 1,480,804 A | * | 1/1924 | Fish, Jr. ........................ | 34/350 |
| 1,721,686 A | * | 7/1929 | Boykin ........................ | 554/9 |
| 1,775,699 A | * | 9/1930 | Silver .......................... | 8/142 |
| 2,016,552 A | * | 10/1935 | McCreery ................... | 68/18 C |
| 2,114,776 A | * | 4/1938 | Davis ......................... | 68/18 R |

(Continued)

FOREIGN PATENT DOCUMENTS

CN          1612303 A          5/2005

(Continued)

*Primary Examiner*—Stephen M. Gravini
(74) *Attorney, Agent, or Firm*—Smith, Gambrell & Russell, LLP

(57) ABSTRACT

A vapor drying apparatus comprises a processing chamber 1*a* adapted to contain semiconductor wafers W; a supply nozzle 2 adapted to supply IPA vapor or N2 gas into the processing chamber 1*a*; a two-fluid nozzle 3 connected to both of an IPA supply source 8 and an N2 gas supply source 5 and adapted to produce a mixed fluid of IPA and N2 gas; a vapor generating apparatus 10 adapted to produce IPA vapor by heating the mixed fluid produced by the two-fluid nozzle 3; an N2 gas supply line 23 connected to the upstream side of the two-fluid nozzle 3; and a mixed fluid supply line 22 connected to the downstream side of the two-fluid nozzle 3. An open-and-close valve V2 is provided on a branch line 25 connecting the N2 gas supply line 23 and the mixed fluid supply line 22. First, N2 gas is supplied to the two-fluid nozzle 3 while IPA from the IPA supply source 8 is supplied to the two-fluid nozzle 3 so as to produce the mixed fluid, followed by supplying it to the processing chamber 1*a* so as to perform a first drying step. Subsequently, N2 gas from the N2 gas supply source 5 is supplied to the processing chamber 1*a* through the two-fluid nozzle 3 and the branch line 25 so as to perform a second drying step.

2 Claims, 8 Drawing Sheets

U.S. PATENT DOCUMENTS

| | | | |
|---|---|---|---|
| 2,369,366 A * | 2/1945 | O'Neill | 34/267 |
| 2,400,726 A * | 5/1946 | Wright et al. | 118/52 |
| 2,422,536 A * | 6/1947 | Finnegan | 34/77 |
| 2,467,435 A * | 4/1949 | Langhurst | 202/173 |
| 2,573,966 A * | 11/1951 | Hamlin | 8/142 |
| 2,681,512 A * | 6/1954 | Armstrong | 34/526 |
| 2,818,719 A * | 1/1958 | Cline | 68/19.2 |
| 2,897,600 A * | 8/1959 | Graham et al. | 34/667 |
| 3,018,562 A * | 1/1962 | Orr | 34/75 |
| 3,110,544 A * | 11/1963 | Moulthrop | 8/137 |
| 3,113,445 A * | 12/1963 | Williams et al. | 68/12.08 |
| 3,131,035 A * | 4/1964 | Erickson | 34/77 |
| 3,152,872 A * | 10/1964 | Scoggin et al. | 34/407 |
| 3,203,110 A * | 8/1965 | Fuhring et al. | 34/80 |
| 3,212,197 A * | 10/1965 | Crawford | 34/371 |
| 3,218,728 A * | 11/1965 | Barth et al. | 34/292 |
| 3,233,338 A * | 2/1966 | Slipson | 34/77 |
| 3,256,613 A * | 6/1966 | Moulthrop | 34/402 |
| 3,267,701 A * | 8/1966 | Mandarino | 68/12.15 |
| 3,273,256 A * | 9/1966 | Behrens | 34/546 |
| 3,516,174 A * | 6/1970 | Behrens | 34/534 |
| 3,714,719 A * | 2/1973 | Wayne | 34/74 |
| 3,934,354 A * | 1/1976 | Hope et al. | 34/336 |
| 4,064,636 A * | 12/1977 | Downing | 34/60 |
| 4,077,467 A * | 3/1978 | Spigarelli | 34/75 |
| 4,086,705 A * | 5/1978 | Wehr | 34/469 |
| 4,319,410 A * | 3/1982 | Heilhecker et al. | 34/75 |
| 4,345,609 A * | 8/1982 | Nishizawa | 134/57 R |
| 4,497,121 A * | 2/1985 | Choinski | 34/445 |
| 4,545,134 A * | 10/1985 | Mukerjee et al. | 34/468 |
| 4,612,712 A * | 9/1986 | Pescatore et al. | 34/68 |
| 4,635,380 A * | 1/1987 | Anderson | 34/468 |
| 4,640,344 A * | 2/1987 | Pravda | 165/86 |
| 4,665,628 A * | 5/1987 | Clawson | 34/449 |
| 4,685,220 A * | 8/1987 | Meenan et al. | 588/320 |
| 4,777,970 A * | 10/1988 | Kusuhara | 134/66 |
| 4,841,645 A * | 6/1989 | Bettcher et al. | 34/78 |
| 4,977,688 A * | 12/1990 | Roberson et al. | 34/92 |
| 5,020,237 A * | 6/1991 | Gross et al. | 34/265 |
| 5,047,123 A * | 9/1991 | Arvanitakis | 202/170 |
| 5,081,772 A * | 1/1992 | Wyman | 34/79 |
| 5,105,556 A * | 4/1992 | Kurokawa et al. | 34/470 |
| 5,160,440 A * | 11/1992 | Merai | 210/710 |
| 5,248,393 A * | 9/1993 | Schumacher et al. | 202/158 |
| 5,315,766 A * | 5/1994 | Roberson et al. | 34/409 |
| 5,335,425 A * | 8/1994 | Tomizawa et al. | 34/265 |
| 5,425,183 A * | 6/1995 | Taylor | 34/73 |
| 5,657,553 A * | 8/1997 | Tarui et al. | 34/78 |
| 5,709,037 A * | 1/1998 | Tanaka et al. | 34/330 |
| 5,715,612 A * | 2/1998 | Schwenkler | 34/470 |
| 5,780,295 A * | 7/1998 | Livesey et al. | 435/307.1 |
| 5,855,077 A * | 1/1999 | Nam et al. | 34/409 |
| 5,884,640 A * | 3/1999 | Fishkin et al. | 134/95.2 |
| 5,913,981 A * | 6/1999 | Florez | 134/3 |
| 5,940,985 A * | 8/1999 | Kamikawa et al. | 34/471 |
| 5,950,328 A * | 9/1999 | Ichiko et al. | 34/364 |
| 5,985,041 A * | 11/1999 | Florez | 134/2 |
| 6,029,371 A * | 2/2000 | Kamikawa et al. | 34/516 |
| 6,095,167 A * | 8/2000 | Florez | 134/183 |
| 6,134,807 A * | 10/2000 | Komino et al. | 34/418 |
| 6,159,360 A * | 12/2000 | Gerteis et al. | 210/103 |
| 6,165,277 A * | 12/2000 | Florez | 134/2 |
| 6,272,770 B1 * | 8/2001 | Slutsky et al. | 34/596 |
| 6,328,809 B1 | 12/2001 | Elsawy et al. | |
| 6,732,448 B2 * | 5/2004 | Strzala | 34/92 |
| 6,918,192 B2 * | 7/2005 | Yang | 34/73 |
| 7,055,262 B2 * | 6/2006 | Goldberg et al. | 34/86 |
| 7,107,999 B2 * | 9/2006 | Sasaki | 134/66 |
| 7,437,834 B2 * | 10/2008 | Nakatsukasa et al. | 34/381 |
| 2001/0037822 A1 | 11/2001 | Elsawy et al. | |
| 2002/0032973 A1 | 3/2002 | Jung | |
| 2002/0184784 A1* | 12/2002 | Strzala | 34/60 |
| 2003/0221331 A1* | 12/2003 | Reddoch | 34/58 |
| 2005/0087211 A1 | 4/2005 | Park et al. | |
| 2006/0179676 A1* | 8/2006 | Goldberg et al. | 34/77 |
| 2006/0236556 A1* | 10/2006 | Ferguson et al. | 34/73 |
| 2007/0006483 A1* | 1/2007 | Kamikawa et al. | 34/467 |
| 2007/0119486 A1 | 5/2007 | Park et al. | |
| 2007/0186340 A1* | 8/2007 | Gay | 4/597 |
| 2008/0060214 A1 | 3/2008 | Nishimura et al. | |
| 2009/0077825 A1* | 3/2009 | Toofan et al. | 34/273 |
| 2009/0178295 A1* | 7/2009 | He et al. | 34/380 |

FOREIGN PATENT DOCUMENTS

| | | |
|---|---|---|
| JP | 10-125649 | 5/1998 |
| JP | 11-354485 | 12/1999 |
| WO | WO 00/22654 | 4/2000 |

* cited by examiner

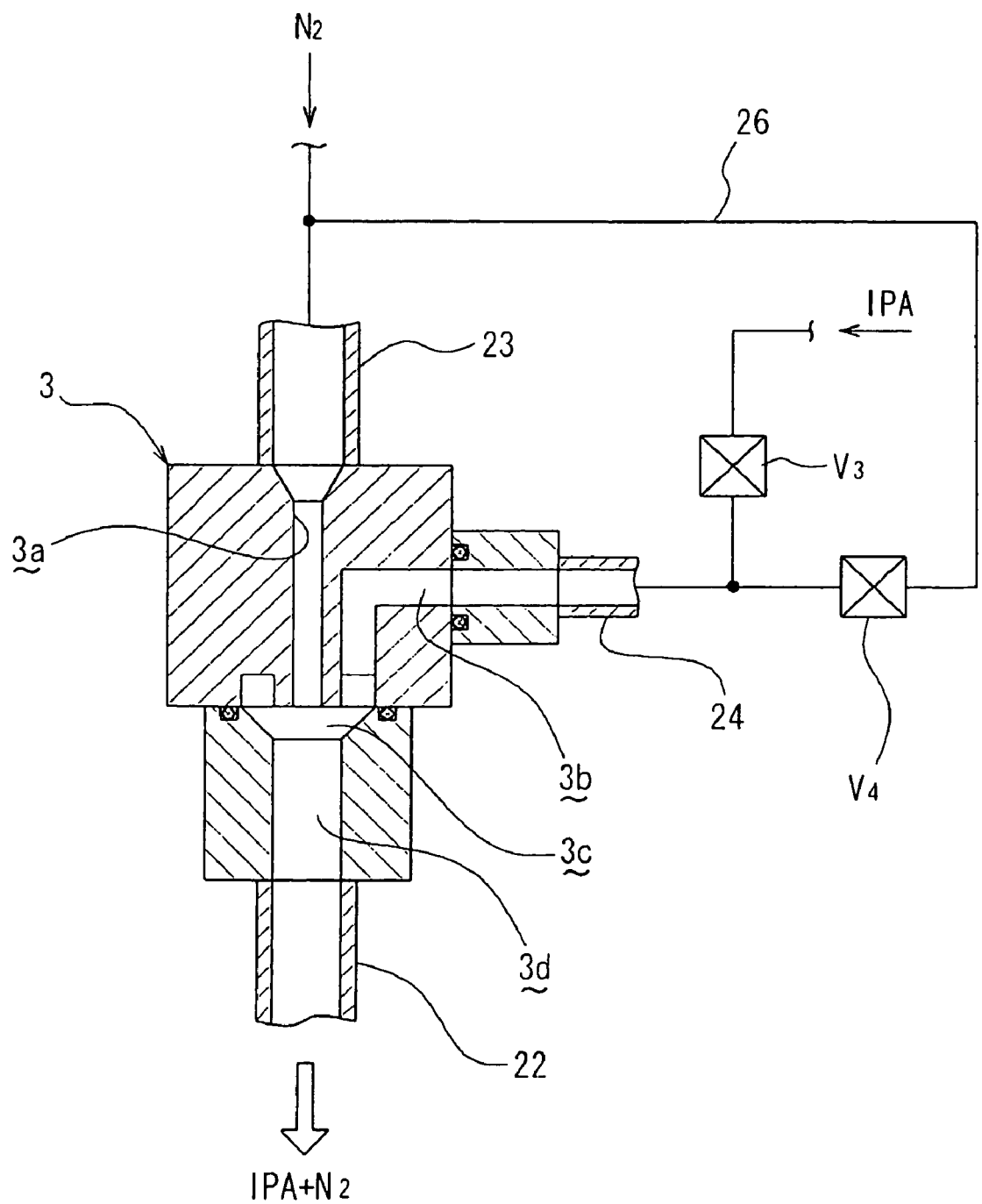
F I G. 2

VAPOR DRYING METHOD, APPARATUS AND RECORDING MEDIUM FOR USE IN THE METHOD

BACKGROUND OF THE INVENTION

1. Field of the Invention

The present invention relates to a vapor drying method, an apparatus and a recording medium for use in the method.

2. Background Art

In the past, the IPA drying technology has been known, which comprises the steps of vaporizing a mixed fluid containing fluids including a liquid(s) or liquid fluid(s), for example, a fluid prepared by mixing an atomized organic solvent, e.g., IPA (isopropyl alcohol), in an inert gas such as nitrogen gas ($N_2$ gas), and then making the vaporized gas contact with an article(s) to be processed (article(s) to be dried) to dry the article (see, for example, Patent Document 1).

According to the vapor drying method (or apparatus), after effecting a first drying step in which vapor comprising IPA and $N_2$ gas is supplied to a processing chamber containing an article(s) for example a semiconductor wafer(s) (hereinafter referred to as wafer(s)), a second drying step in which only $N_2$ gas is supplied to the processing chamber to vaporize and remove IPA attached to the wafer(s) can be performed.

Document cited:

Patent Document 1: TOKUKAIHEI No. 10-125649

However, in the conventional vapor drying method (or apparatus) of this type, because of heating after mixing IPA and $N_2$ gas by using a mixing means, the flow amount of $N_2$ gas possible to flow into the mixing means is restricted due to an optimum range of the proportion in mixing the IPA and $N_2$ gas. In the case where the second drying step is performed successively after the first drying step, $N_2$ gas is supplied to the processing chamber by supplying only the $N_2$ gas to the mixing means.

In such a way, since the flow amount of $N_2$ gas possible to supply to the mixing means is set in a range which is optimum for mixing IPA, this flow amount should be restricted. Thus, when $N_2$ gas is used in the second drying step, because of the smaller supply amount, the time required for the second drying step should be increased, leading to an adverse effect on the drying ability, such as occurrence of water marks. In addition, supplying a smaller amount of the inert gas for a rather long period of time may lead to considerable waste of the inert gas.

SUMMARY OF THE INVENTION

The present invention was made in view of the above problems. Accordingly, it is an object of the present invention to provide a vapor drying method, a vapor drying apparatus and a recording medium, by which reduction of the drying time and enhancement of the drying ability can be achieved and the inert gas can be utilized effectively.

The present invention is a vapor drying method, comprising: a mixing step of mixing an inert gas supplied from an inert gas supply line and a solvent supplied from a solvent supply line using a mixed fluid producing means to produce a mixed fluid; a vapor producing step of producing vapor by heating the mixed fluid using a mixed fluid heating means; a first drying step of supplying the vapor produced in the vapor producing step to a processing chamber to dry objects to be processed; a heating step of heating an inert gas using an inert gas heating means; and a second drying step of supplying the inert gas heated in the heating step to the processing chamber to dry the objects to be processed; wherein the supply amounts of the inert gases used for the first drying step and the second drying step are set separately such that the supply amount of the inert gas upon the second drying step is increased relative to those upon the first drying step.

The present invention is the vapor drying method, wherein after the first drying step, the supply of the inert gas to the processing chamber in the second drying step is controlled such that the inert gas is supplied to the processing chamber through a branch line connected to the upstream side of the mixed fluid producing means.

The present invention is the vapor drying method, wherein the inert gas is supplied to the downstream side of an open-and-close valve provided on the solvent supply line connected to the mixed fluid producing means so as to remove the solvent remaining in the mixed fluid producing means.

The present invention is a vapor drying apparatus, comprising: a processing chamber adapted to contain objects to be processed; a solvent supply source; an inert gas supply source; a mixed fluid producing means connected to the solvent supply source and the inert gas supply source through a solvent supply line and an inert gas supply line, respectively, and adapted to produce a mixed fluid of a solvent and an inert gas; and a vapor producing means adapted to receive the mixed fluid produced by the mixed fluid producing means through a mixed fluid supply line and produce vapor by heating the mixed fluid using a heating means; wherein the inert gas supply line connected to the mixed fluid producing means and the mixed fluid supply line connected to the mixed fluid producing means are connected to each other through a branch line on which an open-and-close valve is provided, so that the inert gas to be supplied from the inert gas supply source can be supplied into a processing chamber through the branch line and the mixed fluid producing means.

The present invention is the vapor drying apparatus, wherein an open-and-close valve is provided on the solvent supply line connected to the mixed fluid producing means, and a sub-branch line is connected to the downstream side of the open-and-close valve, the sub-branch line being branched from the inert gas supply line and having an open-and-close valve.

The present invention is the vapor drying apparatus, further comprising: a first control means adapted to control operation of supplying the vapor produced in the vapor producing means to the processing chamber; operation of opening and closing the open-and-close valve of the branch line; and operation of supplying the inert gas heated in the heating means of the vapor producing means to the processing chamber.

The present invention is the vapor drying apparatus, further comprising: a second control means adapted to control opening and closing of the open-and-close valve of the sub-branch line, so that the solvent remaining in the mixed fluid producing means can be removed by opening the open-and-close valve of the sub-branch line using the second control means.

The present invention is a computer readable recording medium for use in a vapor drying process and adapted to store a software for operating a computer to perform a control program, wherein based on the control program, when it is performed, the computer controls a vapor drying apparatus to perform a vapor drying method, wherein the vapor drying method comprises: a mixing step of mixing an inert gas supplied from an inert gas supply line and a solvent supplied from a solvent supply line using a mixed fluid producing means to produce a mixed fluid; a vapor producing step of producing vapor by heating the mixed fluid using a mixed fluid heating means; a first drying step of supplying the vapor produced in the vapor producing step to a processing chamber to dry objects to be processed; a heating step of heating an inert gas using an inert gas heating means; and a second drying step of supplying the inert gas heated in the heating step to the processing chamber to dry the objects to be processed; wherein the supply amounts of the inert gases used for the first drying step and the second drying step are set separately such that the supply amount of the inert gases upon the second drying step is increased relative to those upon the first drying step.

The present invention is the recording medium for use in a vapor drying process, wherein based on the control program, when it is performed, the computer controls the vapor drying apparatus such that a step of supplying the inert gas to the processing chamber through a branch line connected to the upstream side of the mixed fluid producing means is performed in the second drying step after the first drying step.

The present invention is a control program for use in a vapor drying process and operating a computer, wherein based on the control program, when it is performed, the computer controls a vapor drying apparatus to perform a vapor drying method, wherein the vapor drying method comprises: a mixing step of mixing an inert gas supplied from an inert gas supply line and a solvent supplied from a solvent supply line using a mixed fluid producing means to produce a mixed fluid; a vapor producing step of producing vapor by heating the mixed fluid using a mixed fluid heating means; a first drying step of supplying the vapor produced in the vapor producing step to a processing chamber to dry objects to be processed; a heating step of heating the inert gas using an inert gas heating means; and a second drying step of supplying the inert gas heated in the heating step to the processing chamber to dry the objects to be processed; wherein the supply amounts of the inert gases used for the first drying step and the second drying step are set separately such that the supply amount of the inert gases upon the second drying step is increased relative to those upon the first drying step.

The present invention is the control program, wherein based on the control program, when it is performed, the computer controls the vapor drying apparatus such that a step of supplying the inert gas to the processing chamber through a branch line connected to the upstream side of the mixed fluid producing means is performed in the second drying step after the first drying step.

The present invention is a method of producing vapor, comprising: a vaporizing step of substantially vaporizing a fluid containing a liquid; and a temperature rising step of elevating the temperature of the vaporized fluid to a predetermined temperature.

The present invention is the method of producing vapor, wherein in the vaporizing step, the fluid containing a liquid is heated to a temperature above the boiling point of the liquid.

The present invention is the method of producing vapor, further comprising the steps of: detecting the temperature of the fluid vaporized by the vaporizing step and controlling the heating temperature of the vaporizing step based on the detected temperature thereof; and detecting the temperature of the vapor elevated by the temperature rising step and controlling the heating temperature of the temperature rising step based on the detected temperature thereof.

The present invention is a vapor generating apparatus, comprising: a first heating unit adapted to heat and substantially vaporize a fluid containing a liquid; and a second heating unit adapted to heat the vaporized fluid and elevate the temperature of the fluid to a predetermined temperature.

The present invention is the vapor generating apparatus, wherein the first heating unit can heat the fluid containing the liquid to a temperature above the boiling point of the liquid.

The present invention is the vapor generating apparatus, further comprising: a first temperature detecting means adapted to detect the temperature of the fluid vaporized by the first heating unit; a second temperature detecting means adapted to detect the temperature of the vapor elevated by the second heating unit; and a control means adapted to control the heating temperature of the first heating unit based on the temperature detected by the first temperature detecting means as well as to control the heating temperature of the second heating unit based on the temperature detected by the second temperature detecting means.

The present invention is a vapor processing apparatus, comprising: a vapor supplying means adapted to supply vapor for use in a process to a processing chamber; a fluid producing means adapted to produce a fluid containing a liquid; a line adapted to connect the vapor supplying means and the fluid producing means; a first heating unit provided on the line and adapted to heat and substantially vaporize the fluid containing the liquid; and a second heating unit provided on the line and adapted to heat the vaporized fluid and elevate the temperature of the fluid to a predetermined temperature.

The present invention is the vapor processing apparatus, wherein in the first heating unit, the fluid containing the liquid can be heated to a temperature above the boiling point of the liquid.

The present invention is the vapor processing apparatus, further comprising: a first temperature detecting means adapted to detect the temperature of the fluid vaporized by the first heating unit; a second temperature detecting means adapted to detect the temperature of the vapor elevated by the second heating unit; and a control means adapted to control the heating temperature of the first heating unit based on the temperature detected by the first temperature detecting means as well as to control the heating temperature of the second heating unit based on the temperature detected by the second temperature detecting means.

The present invention is a computer readable recording medium for use in a vapor production and adapted to store a software for operating a computer to perform a control program, wherein based on the control program, when it is performed, the computer controls a vapor drying apparatus to perform a vapor drying method, wherein the vapor drying method comprises: a vaporizing step of substantially vaporizing a fluid containing a liquid; and a temperature rising step of elevating the temperature of the vaporized fluid to a predetermined temperature.

The present invention is a control program for use in a vapor production and operating a computer, wherein based on the control program, when it is performed, the computer controls a vapor drying apparatus to perform a vapor drying method, wherein the vapor drying method comprises: a vaporizing step of substantially vaporizing a fluid containing a liquid; and a temperature rising step of elevating the temperature of the vaporized fluid to a predetermined temperature.

According to the present invention, after the first drying step is performed by supplying the vapor to the processing chamber containing objects to be processed to dry the articles, the second drying step is performed by supplying the heated inert gas to the processing chamber to dry the objects to be processed. In the second drying step, the solvent attached to the objects to be processed can be removed by supplying a greater amount of the inert gas than the supply amount of the inert gas upon the first drying step.

According to the present invention, after the first drying step, by supplying the inert gas through the branch line connected to the upstream side of the mixed fluid producing means, the flow amount of the inert gas in the second drying step can be increased.

According to the present invention, by connecting the sub-branch line branched from the inert gas supply line to the downstream side of the open-and-close valve provided on the solvent supply line connected to the mixed fluid producing means, the solvent remaining in the mixed fluid producing means can be removed.

According to the present invention, after the fluid containing the liquid is substantially vaporized by the vaporizing step utilizing the first heating unit, the temperature of the vaporized fluid can be elevated to a predetermined temperature by the temperature rising step utilizing the second heating unit. In this case, the first temperature detecting means detects the temperature of the fluid vaporized by the first heating unit and transmits the detected temperature to the control means so as to control the heating temperature of the first heating unit based on a control signal from the control means, while the second temperature detecting means detects the temperature of the vapor subjected to the temperature rising step by the second heating unit and transmits the detected signal to the control means so as to control the heating temperature of the second heating unit based on a control signal from the control means.

According to the present invention, the fluid containing the liquid, produced by the fluid producing means and flowing in the corresponding line, is heated and substantially vaporized by the vaporizing step utilizing the first heating unit. Subsequently, the temperature of the vaporized fluid is elevated to a predetermined temperature by the temperature rising step utilizing the second heating unit, thus the vapor subjected to the temperature rising step up to the predetermined temperature can be supplied into the processing container by the vapor supply means. In this case, the first temperature detecting means detects the temperature of the fluid vaporized by the first heating unit and transmits the detected temperature to the control means so as to control the heating temperature of the first heating unit based on a control signal from the control means. At the same time, the second temperature detecting means detects the temperature of the vapor subjected to the temperature rising step by the second heating unit and transmits the detected signal to the control means so as to control the heating temperature of the second heating unit based on a control signal from the control means.

According to the present invention, since it is constructed as mentioned above, the following outstanding effects can be obtained.

According to the present invention, after the first drying step for drying the objects to be processed is performed by supplying the vapor to the processing chamber containing the objects to be processed, the second drying step for drying the objects to be processed is performed by supplying the heated inert gas to the processing chamber. Since in the second drying step the solvent attached to the objects to be processed can be removed by supplying a greater amount of the inert gas into the processing chamber than the supply amount of the inert gas upon the first drying step, reduction of the drying time and enhancement of the drying ability can be achieved while the inert gas can be utilized effectively.

According to the present invention, after the first drying step, by supplying the inert gas to the processing chamber through the branch line connected to the upstream side of the mixed fluid producing means, the flow amount of the inert gas in the second drying step can be increased. Thus, further effective utilization of the inert gas can be achieved, leading to reduction of the drying time.

According to the present invention, by connecting the sub-branch line branched from the inert gas supply line to the downstream side of the open-and-close valve provided on the solvent supply line connected to the mixed fluid producing means, the solvent remaining in the mixed fluid producing means can be reduced using the inert gas supplied from the sub-branch line. As such, it can be securely prevented that the solvent is supplied into the processing chamber upon starting a further drying step, thus enhancing the precision of the process.

According to the present invention, since after the fluid containing the liquid is substantially vaporized the temperature of the vaporized fluid can be elevated to a predetermined temperature, the time required for the vapor production can be reduced, and additionally, the vapor, not containing the liquid, with a temperature appropriate for the process can be produced stably with high efficiency.

According to the present invention, since it is possible to detect the temperature of the fluid vaporized by the first heating unit and detect the temperature of the vapor subjected to the temperature rising step by the second heating unit as well as to control the heating temperature of the first heating unit and control the heating temperature of the second heating unit based on the detected temperatures, respectively, further stable and efficient production of the vapor can be achieved, and the reliability of the apparatus can be enhanced.

According to the present invention, after the fluid containing the liquid, produced by the fluid producing means and flowing in the corresponding line, is substantially vaporized, the vaporized fluid can be heated to a predetermined temperature and supplied to the processing chamber by the vapor supply means. Thus, reduction of the time required for the vapor production can be achieved, and additionally the vapor, not containing the liquid, with a temperature appropriate for the process can be produced stably with high efficiency. Accordingly, processing efficiency due to the vapor can be improved.

According to the present invention, since it is possible to detect the temperature of the fluid vaporized by the first heating unit and detect the temperature of the vapor subjected to the temperature rising step by the second heating unit as well as to control the heating temperature of the first heating unit and control the heating temperature of the second heating unit based on the detected temperatures, respectively, further stable and efficient production of the vapor can be achieved, and additionally the processing efficiency can be improved, thus enhancing the reliability of the apparatus.

BRIEF DESCRIPTION OF THE DRAWINGS

FIG. 2 is a schematic cross section showing a mixed fluid producing means (two-fluid nozzle) of the present invention.

DETAILED DESCRIPTION OF THE INVENTION

EXAMPLES

First Embodiment

Hereinafter, one example of the best mode of carrying out the present invention will be described in detail with reference to the accompanying drawings. In this case, a vapor drying apparatus according to the present invention which is applied to a washing and drying system for semiconductor wafers is described.

Figure 1:
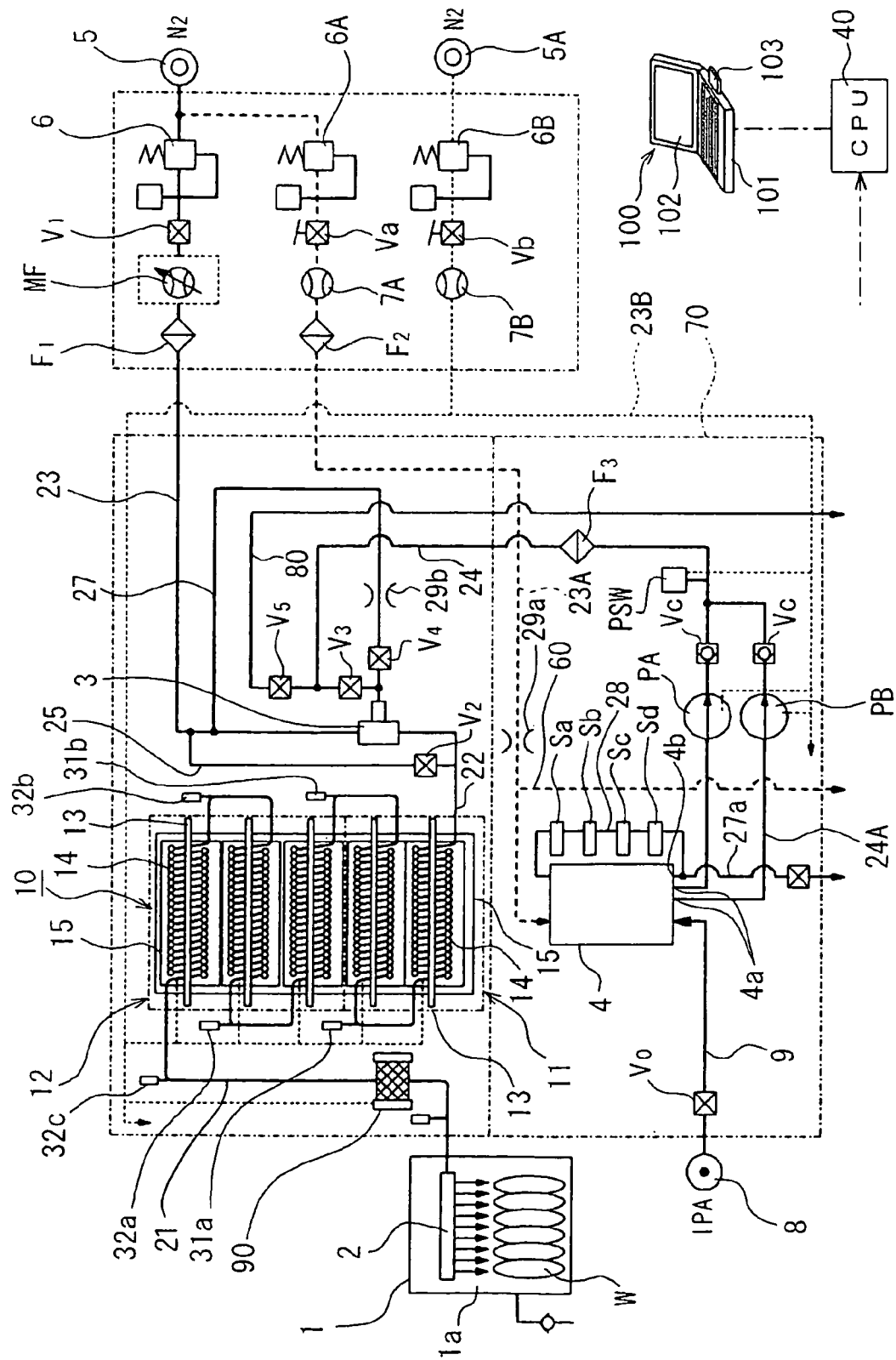
FIG. 1 is a schematic view showing a construction of a washing and drying system to which is applied a vapor drying apparatus according to a first embodiment of the present invention.

FIG. 1 is a schematic view showing a construction of the whole body of a washing and drying system. FIG. 2 is a schematic cross section showing a mixed fluid producing means of the present invention.

The washing and drying system comprises a processing container 1 having a processing chamber 1a for containing semiconductor wafers W (hereinafter referred to as wafers W) to be processed; a supply nozzle 2 as a supply means for supplying (injecting) vapor or inert gas, for example, nitrogen (N2) gas used for drying toward the wafers W in the processing container 1; a vapor generating apparatus 10 which is a vapor producing means for producing vapor of a mixed fluid containing IPA (isopropyl alcohol) as a vaporizable solvent and N2 gas; a two-fluid nozzle 3 as a mixed fluid producing means for producing the mixed fluid containing IPA and N2 gas, i.e., a mixed fluid formed by mixing atomized IPA in N2 gas; a tank 4 (hereinafter referred to as IPA tank 4) connected to an IPA supply source 8 as a solvent supply source and adapted to store an IPA liquid; an N2 gas supply source 5 as an inert gas supply source; a vapor supply line 21 for connecting the supply nozzle 2, vapor generating apparatus 10, 2-fluid nozzle 3, IPA tank 4 and N2 gas supply source 5; a mixed fluid supply line 22; an N2 gas supply line 23 and an IPA supply line 24; a branch line 25 having an open-and-close valve V2 adapted to connect the N2 gas supply line 23 and the mixed fluid supply line 22; and a sub-branch line 27 for connecting the downstream side of an open-and-close valve V3, provided in the vicinity of the two-fluid nozzle 3 on the IPA supply line 24, to the N2 gas supply line 23.

The two-fluid nozzle 3, as shown in FIG. 2, includes an N2 gas supply channel 3a connected to the N2 supply line 23, an IPA supply channel 3b connected to the IPA supply line 24, a mixing chamber 3c adapted to mixing N2 gas and IPA flowing in these supply channels 3a, 3b, and a mixed fluid supply channel 3d which is in fluid communication with the mixed fluid supply channel 3c and connected to the mixed fluid supply line 22, such that the nozzle 3 is configured to change liquid IPA into an atomized state utilizing a flow speed of N2 gas and supply the mixed gas to the vapor generating apparatus 10. On the N2 gas supply line 23 connected to the N2 gas supply channel 3a of the two-fluid nozzle 3, a pressure reducing valve 6, an open-and-close valve V1, a mass flow controller MF and a filter F1 are arranged in succession from the side of the N2 gas supply source 5. The N2 gas supply line 23 and the mixed fluid supply line 22 are connected to each other through the branch line 25. On the branch line 25 the open-and-close valve V2 is provided in parallel with the two-fluid nozzle 3.

In this way, the connection of the N2 gas supply line 23 and the mixed fluid supply line 22 through the branch line 25 as well as the provision of the open-and-close valve V2 in parallel with the two-fluid nozzle 3 on the branch line 25 enables to supply a mixed fluid of IPA and N2 gas from the two-fluid nozzle 3 by closing the open-and-close valve V2 upon the IPA drying step (first drying step). However, upon the drying step using only the N2 gas (second drying step), it is possible to supply only the N2 gas from the two-fluid nozzle 3 while supplying N2 gas from the branch line 25 by opening the open-and-close valve V2, thus achieving to flow N2 gas in a greater amount. When the open-and-close valve V2 is opened, since the cross section of the flow channel of branch line 25 is much larger than that of the two-fluid nozzle 3, most of the N2 gas will flow through the branch line 25. Namely, upon the first drying step, N2 gas can be supplied from the N2 gas supply source 5 in a flow amount suitable for producing the mixed fluid to be supplied to the two-fluid nozzle 3 and the processing chamber 1a. However, upon the second drying step, in addition to the N2 gas in the flow amount suitable for producing the mixed fluid, N2 gas can also be supplied from the N2 gas supply source 5 to the processing chamber 1a through the branch line 25 via the N2 gas supply line 23. Therefore, by setting advantageously the flow amount of N2 gas to be supplied from the N2 gas supply source 5, the first drying step and the second drying step can be performed with high efficiency. During the second drying step, the flow amount of N2 gas may be increased than that in the first drying step. It is noted that additional open-and-close valves (not shown) may be provided on the upstream side or downstream side of the two-fluid nozzle 3 so as to switch the route on the side of two-fluid nozzle 3 and the route on the side of branch line 25 by opening such additional open-and-close valves upon producing the vapor or otherwise by closing these valves upon supplying only the N2 gas. Consequently, upon the N2 drying step, it can be prevented that the IPA remaining in the two-fluid nozzle 3 is supplied to the processing chamber 1a.

The open-and-close valves V1, V2 and V3 are electrically connected to a control means (first control means), for example, a central processing unit 40 (hereinafter referred to as CPU 40), and configured to open and close based on a control signal from the CPU 40, respectively.

The IPA supply channel 3b of the two-fluid nozzle 3 is connected to an outlet 4a provided at the bottom portion of the IPA tank 4 through the IPA supply line 24. In this case, two outlets 4a are provided, and the IPA supply line 24 is connected to one of the outlets 4a, while an IPA supply branch line 24A which is connected to the other outlet 4a is also connected to a middle portion of the IPA supply line 24. Reciprocating IPA pumps PA, PB are provided in parallel on the IPA supply line 24 and the IPA supply branch line 24A, respectively. On the downstream side (discharging side) of the IPA supply pumps PA, PB of the IPA supply line 24 and the IPA supply branch line 24A, check valves Vc are provided, respectively. In addition, on the downstream side of the connection point of the IPA supply line 24 to the IPA supply branch line 24A, a pressure switch PSW and a filter F3 are provided. Both the IPA supply pumps PA, PB and the pressure switch PSW are electrically connected to the CPU 40 and configured to operate with a phase difference (retardation) relative to each other based on a control signal from the CPU 40. Such actuation of both the IPA supply pumps PA, PB with a phase difference enables to restrain pulsation upon the IPA supply as well as to precisely control the supply amount of IPA. In this case, the flow amount is identified by monitoring the pressure of the IPA supply pumps PA, PB using the pressure switch PSW.

A pipe line 28 for measuring the amount of IPA is connected to a top end of the IPA tank 4 as well as connected to a tank drain line 27*a* which is connected to the drain opening 4*b* provided at a bottom portion of the IPA tank 4. On the measuring line 28, an upper limit sensor Sa for detecting an upper limit amount of IPA in the IPA tank 4, a proper quantity sensor Sb for detecting a proper quantity of IPA, a check sensor Sc for checking operation of the IPA supply pumps PA, PB, and a lower limit sensor Sd for detecting a lower limit amount of IPA are provided in succession from the upper. These sensors Sa to Sd are electrically connected to the CPU 40 and transmit signals detected thereby to the CPU 40, respectively, such that actuation and discontinuation of the IPA supply pumps PA, PB, opening and closing of an open-and-close valve V0 provided on a supply line 9 connecting the IPA supply source 8 and the IPA tank 4, can be performed based on the control signals from the CPU 40. In this case, a sequence for calculating and identifying the time from start of discharging IPA to its predetermined passage point is incorporated in the check sensor Sc.

An overflow line 60 is connected to the top end of the IPA tank 4, and an N2 gas branch supply line 23A branched from the N2 gas supply source 5 of the N2 gas supply line 23 is connected to a middle portion of the overflow line 60. On the N2 gas branch supply line 23A, a pressure reducing valve 6A, a manual open-and-close valve Va, an orifice 7A and a filter F2 are arranged in succession from the side of the N2 gas supply source 5, and an orifice 29*a* is provided on the upstream side of the connecting portion to the overflow line 60.

In such a construction, since N2 gas can be supplied continuously through the overflow line 60 into the IPA tank 4, invasion of contaminated gas into the IPA tank 4 from the overflow line 60 upon discharging IPA from the IPA tank 4 can be prevented. Additionally, the supply of N2 gas to a middle portion of the overflow line 60 also solves the following problems. If N2 gas is supplied directly into the IPA tank 4, this would lower the ambient concentration of IPA in the space above the surface of IPA in the IPA tank 4, facilitating volatilization thus leading to waste of IPA. On the other hand, the supply of N2 gas to a middle portion of the overflow line 60 can effectively control indirect application of N2 gas to the IPA tank 4, thus solving the above problem.

The open-and-close valve V3 is provided to the IPA supply line 24 in the vicinity of the IPA supplying portion of the two-fluid nozzle 3, and the sub-branch line 27 branched from the N2 gas supply line 23 is connected between the downstream side of the open-and-close valve V3 and the two-fluid nozzle 3. To the sub-branch line 27, an open-and-close valve V4 and an orifice 29 are provided in succession from the side of the two-fluid nozzle 3.

In this way, by connecting the sub-branch line 27 branched from the N2 gas supply line 23 between the downstream side of the open-and-close valve V3 on the IPA supply line 24 and the two-fluid nozzle 3, after finishing the supply of IPA using the IPA supply pumps PA, PB, the IPA remaining in the IPA supply line 24 up to the two-fluid nozzle 3 can be purged to the two-fluid nozzle 3 utilizing N2 gas, thus IPA will no longer remain in the IPA supply line 24. Accordingly, the possibility that IPA would be supplied upon the N2 drying step can be eliminated. It is noted that the open-and-close valve V4 is controlled by a second control means of the CPU 40.

In the vicinity of the upstream side of open-and-close valve V3 on the IPA supply line 24, an IPA drain line 80 is connected through an open-and-close valve V5. In this case, in place of the open-and-close valve V5, a safety valve may be provided on the IPA drain line 80.

The vapor generating apparatus 10, two-fluid nozzle 3, IPA tank 4, IPA supply pumps PA, PB, including the piping for these components, are disposed in a clean room 70 isolated from the open air, the clean room 70 being configured such that purified N2 gas is supplied therein through an N2 gas supply line 23B connected to an N2 gas supply source 5A (see FIG. 1). On the N2 gas supply line 23B, a pressure reducing valve 6B, a manual open-and-close valve Vb and an orifice 7B are arranged in succession from the side of the N2 gas supply source 5A.

Again, the components, such as the open-and-close valves V0, V4, V5 and mass flow controller MF, other than the aforementioned open-and-close valves V1, V2, V3, are also in electrical communication with the CPU 40 and configured to operate based on signals transmitted from the CPU 40, respectively.

Figure 3:
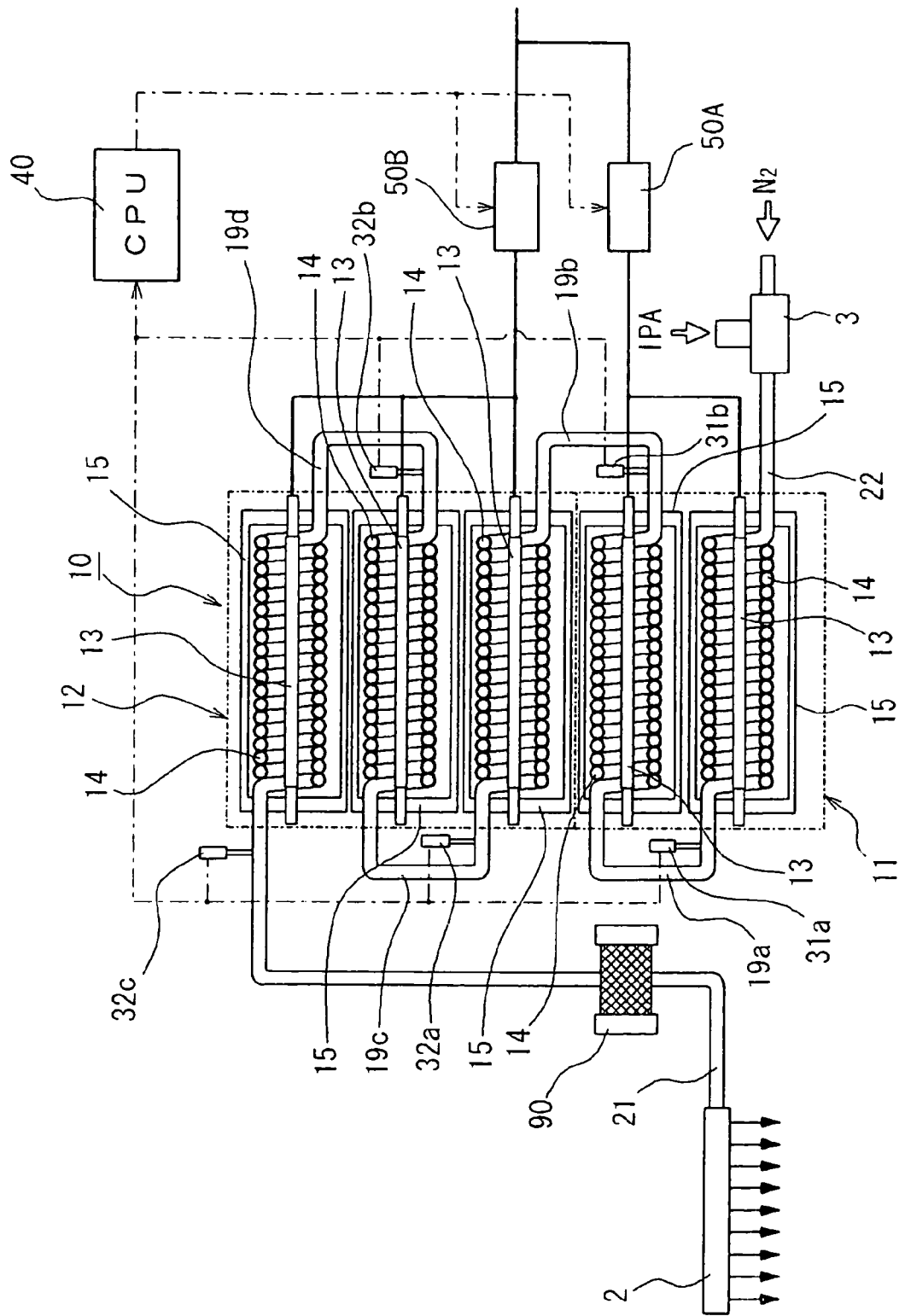
FIG. 3 is a schematic cross section showing a vapor producing means (vapor generating apparatus) of the present invention.

The vapor generating apparatus 10, as shown in FIG. 3, is connected to an outlet of the two-fluid nozzle 3, and includes a first heating unit 11 (hereinafter referred to as vaporizing unit 11) as a first heating means for vaporizing the mixed fluid of IPA and N2 gas produced by the two-fluid nozzle 3, and a second heating unit 12 (hereinafter referred to as temperature rising unit 12) as a second heating means for elevating the temperature of the fluid vaporized by the vaporizing unit 11 to a predetermined temperature (e.g., 150 to 200° C.).

Also, the vapor generating apparatus 10 includes a first temperature detecting means 31*b* (hereinafter referred to as vaporizing temperature detecting means 31*b*), as described below, for detecting the temperature of the mixed fluid vaporized by the vaporizing unit 11; a second temperature detecting means 32*c* (hereinafter referred to as temperature rising detecting means 32*c*), as described below, for detecting the temperature of the vapor subjected to the temperature rising step by the temperature rising unit 12; and the CPU 40 which is adapted to control the heating temperature of the heating means constituting the vaporizing unit 11, i.e., the electric current of each halogen lamp 13, as described below, based on the temperature to be detected by the vaporizing temperature detecting means 31*b* as well as to control the heating temperature of the heating means constituting the temperature rising unit 12, i.e., the electric current of each halogen lamp 13, as described below, based on the temperature to be detected by the temperature rising detecting means 32*c*.

In this case, the vaporizing unit 11 includes two vapor generators 15, while the temperature rising unit 12 includes three vapor generators 15. It should be noted that the number of the vapor generators 15 in the vaporizing unit 11 and the temperature rising unit 12 is not limited to the numbers described above.

Figure 4:
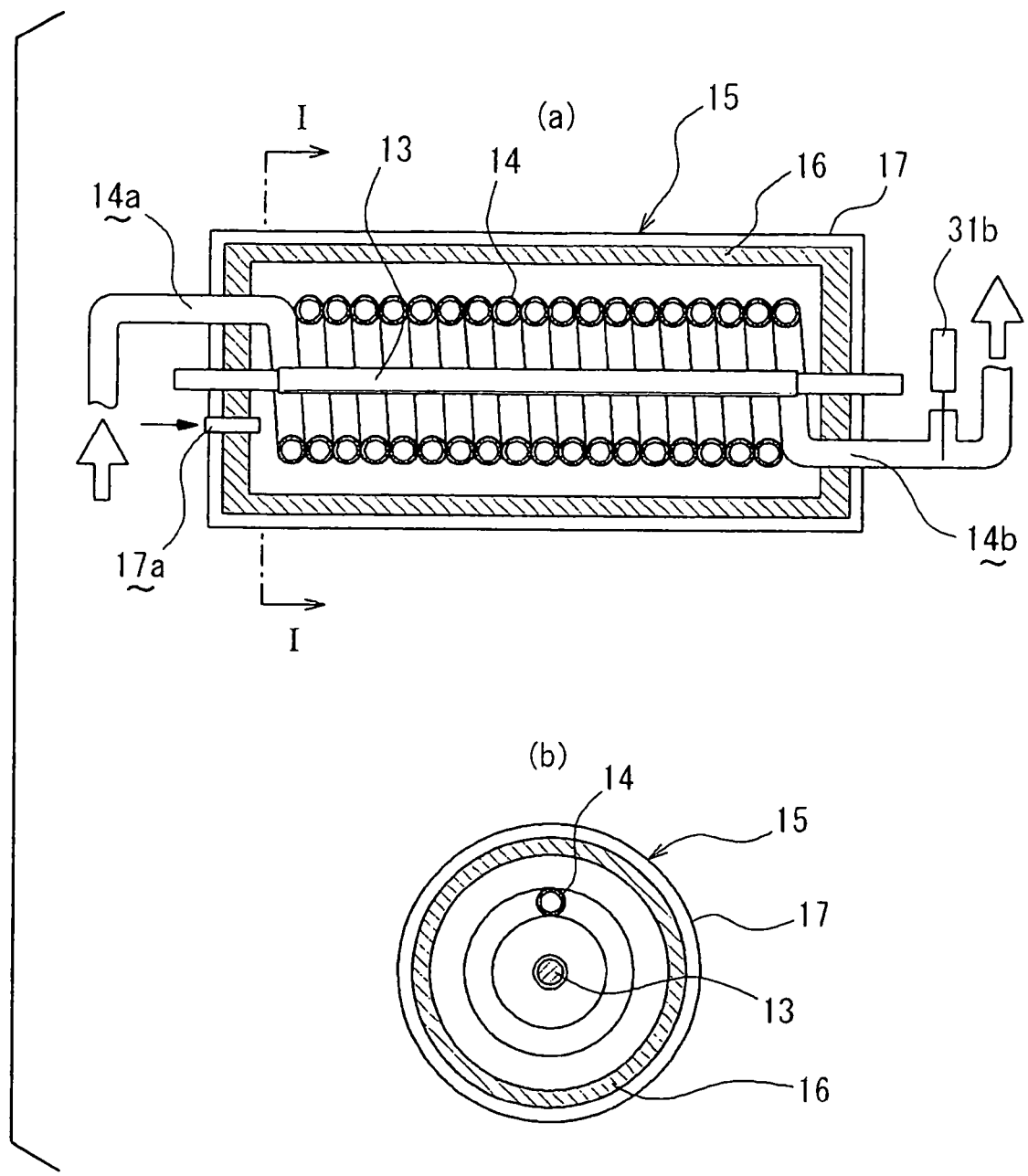
FIG. 4(a) is a cross section of a key portion of the vapor generating apparatus.
FIG. 4(b) is a cross section taken along line I-I of FIG. 4(a).
Figure 8:
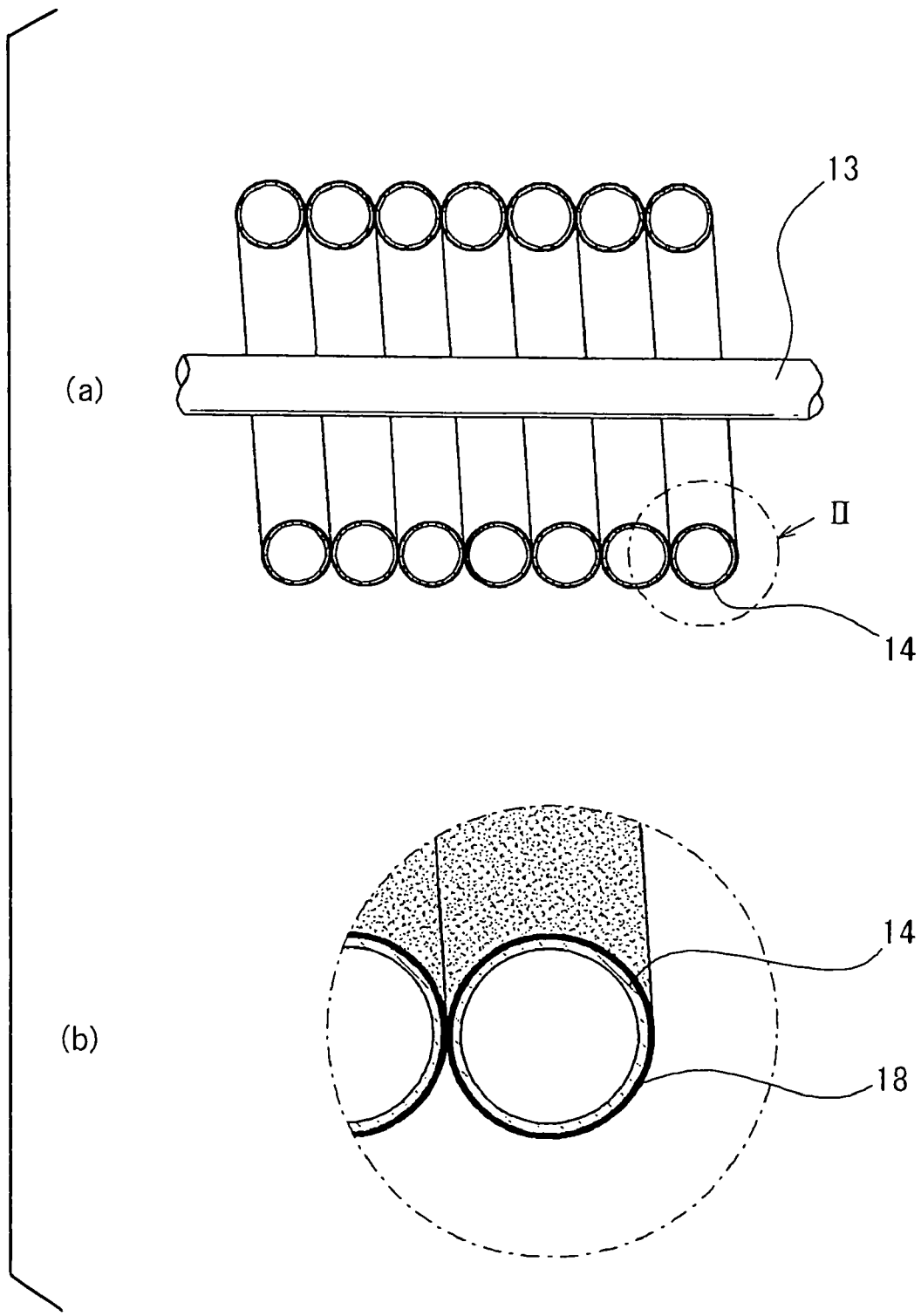
FIG. 8(a) is a cross section of a key portion of the vapor generator of the present invention.
FIG. 8(b) is a cross section taken along line I-I of FIG. 8(a).

Each vapor generator 15 utilizes light energy as the heat source and is configured to convert the light energy into heat energy and then transmit the heat indirectly to the mixed fluid. Namely, each vapor generator 15, as shown in FIG. 4, includes a container body 17 made of stainless steel for example in a form of a sealed tube with a heat insulating material 16 fixed to the inner wall thereof; the halogen lamp 13 as a heating means arranged along the central axis of the container body 17; and a spiral tube 14 in a helical form which surrounds the halogen lamp 13 with a gap defined between the lamp 13 and the tube 14, with each turn of the spiral tube 14 abutting to adjacent ones. One end of the spiral tube 14 provides a fluid inlet 14*a* extending through a side wall of one end of the container body 17 while the other end of the spiral tube 14 provides a fluid outlet 14b extending through a side wall of the other end of the container body 17. The spiral tube 14 is formed of a pipe member made of stainless steel, with the surface coated with a black color paint 18 (see FIGS. 8(*a*), (*b*)) for absorbing radiant light. As such, by coating the surface of the spiral tube 14 with a black color paint for absorbing radiant light, the light radiated from the halogen lamp 13 will be absorbed by the black color paint, converted into heat energy, and then transmitted, uniformly with high efficiency, to the fluid flowing in the spiral tube 14 indirectly therethrough.

Additionally, to the side wall of the one end of the container body 17 is provided an N2 gas supply opening 17a. By supplying N2 gas supplied from the N2 gas supply source 5A into the container body 17, invasion of the ambient gas, for example, the ambient IPA into the container body 17 can be prevented by continuing the supply of N2 gas into the container body 17, as such enhancing the safety of the vapor generators 15.

According to each vapor generator 15 configured as described above, the mixed fluid, produced by mixing atomized IPA with N2 gas and flowing from the inlet 14a to the outlet 14b, can be heated indirectly via the black color paint for absorbing light energy to be radiated from the halogen lamp 13 and the spiral tube 14. In this case, the mixed fluid is vaporized in the vaporizing unit 11, and the vaporized mixed fluid is then heated to a predetermined temperature in the temperature rising unit 12.

The inlet 14a of the vapor generator 15 placed on the upstream side among the two vapor generators 15 constituting the vaporizing unit 11 is connected to the two-fluid nozzle 3 through the mixed fluid supply line 22 while the outlet 14b being connected to the inlet 14a of the vapor generator 15 placed on the downstream side through a first connecting line 19a.

The outlet 14b of the vapor generator 15 placed on the downstream side of the vaporizing unit 11 is connected to the inlet 14a of the vapor generator 15 placed on the upstream side of the temperature rising unit 12 through a second connecting line 19b, and the outlet 14b of the vapor generator 15 placed on the upstream side of the temperature rising unit 12 is connected to the inlet 14a of the vapor generator 15 placed on a middle portion through a third connecting line 19c, and the outlet 14b of the middle vapor generator 15 is connected to the inlet 14a of the vapor generator 15 placed on the downstream side of the temperature rising unit 12 through a fourth connecting line 19d.

Also in the vapor generating apparatus 10 a vaporizing temperature sensor 31b is provided, on the second connecting line 19b, as the vaporizing temperature detecting means for detecting the temperature of the fluid to be vaporized by the vapor generators 15 in the vaporizing unit 11.

On the side of the vapor generators 15 of the vapor supply line 21 connected to the outlet 14b of the downstream vapor generator 15 in the temperature rising unit 12, a temperature rising sensor 32c is provided as the temperature rising detecting means for detecting the temperature of the vapor to be subjected to the temperature rising step by the vapor generators 15.

In addition, on the first connecting line 19a, third connecting line 19c and fourth connecting line 19d, monitoring temperature sensors 31a, 32a and 32b are provided, respectively.

The vaporizing temperature sensor 31b and the temperature rising sensor 32c are electrically connected to the CPU such that temperature information detected thereby can be transmitted to the CPU 40, respectively. By actuation of current regulation units 50A, 50B connected to the halogen lamp 13 of each vapor generator 15 based on a control signal from the CPU 40, the temperatures in the vaporizing step and the temperature rising step can be controlled, respectively. Namely, the temperature information on the vaporizing unit 11 to be detected by the vaporizing temperature sensor 31b is transmitted to the current regulation unit 50A from the CPU 40 so as to control each halogen lamp 13 in the vaporizing unit 11. In addition, the temperature information on the temperature rising unit 12 to be detected by the temperature rising sensor 32c is transmitted to the current regulation unit 50B from the CPU 40 so as to control each halogen lamp 13 in the temperature rising unit 12. In this case, the halogen lamp 13 of each vapor generator 15 in the vaporizing unit 11 is set at a temperature slightly higher than the boiling point of IPA (82.4° C.), for example, the boiling point of IPA +20° C. or less, preferably the boiling point +10° C. or less. The halogen lamp 13 of each vapor generator 15 in the temperature rising unit 12 is set such that the temperature of the produced vapor can be elevated to a predetermined processing temperature (150 to 200° C.). Each temperature information to be detected by the monitoring temperature sensors 31a, 32a, 32b is transmitted to the CPU 40, and displayed on a monitoring device (not shown) based on a control signal from the CPU, thus enabling to monitor the state of vapor in the vapor generating apparatus 10.

The CPU 40 is incorporated in a computer 100, which includes an input-output unit 101 connected to the CPU 40; a display unit 102 adapted to display an inputted picture of each processing step for making a processing plan; and a computer readable storage medium (recording medium) 103 loaded in the input-output unit 101 and adapted to store a software for operating the computer 100 to perform a predetermined program. Based on the program, when it is used, the computer 100 is designed to control the vapor drying apparatus such that a mixing step of mixing IPA and N2 gas to produce a mixed fluid; a vapor producing step of producing vapor by heating the mixed fluid using the vaporizing unit 11 and the temperature rising unit 12 as heating means; a first drying step of supplying the vapor produced in the vapor producing step into the processing chamber 1a through the supply nozzle 2 to dry the wafers W; a heating step of heating N2 gas in the vaporizing unit 11 and the temperature rising unit 12; and a second drying step of supplying N2 gas heated in the heating step into the processing chamber 1a through the supply nozzle 2 to dry the wafers W, are performed.

Also, based on the program, after the first drying step, the computer 100 is designed to control the vapor drying apparatus such that a step of supplying N2 gas into the processing chamber 1a by opening the open-and-close valve V2 provided on the branch line 25 connected to the upstream side of the two-fluid nozzle 3, is performed.

The recording medium 103 may be those fixedly provided to the computer 100, or those detachably loaded on a reader provided to the computer 100 and able to be read by such a reader. In the most typical embodiment, the reading medium 103 is a hard disk drive in which a control software is installed by a service man of a maker of substrate processing apparatuses. In another embodiment, the recording medium 103 may be a read-only removal disk, such as CD-ROMs or DVD-ROMs, in which a control software is written. Such a removal disk is read by an optical reader provided to the computer 100. The recording medium 103 may be any type of RAMs (random access memories) or ROMs (read only memories), or may be a cassette type ROM. In short, any suitable one known in the field of art of computers may be used as the recording medium 103. It is noted that in a factory where a plurality of vapor drying apparatuses are placed the control software may be housed in a control computer adapted to generally control the computers 100 of the respective vapor drying apparatuses. In such a case, each vapor drying apparatus is equipped with communication lines such that it can be operated by the control computer to perform a predetermined process.

To the vapor supply line 21 is provided a metal filter 90 equipped with a heater such that impurities contained in the vapor to be processed can be removed by the metal filter 90.

A mixed fluid heating means for use in heating a mixed fluid of N2 gas and IPA is composed of the vaporizing unit 11 and the temperature rising unit 12. While an inert gas heating means for heating N2 gas is also formed of the vaporizing unit 11 and the temperature rising unit 12, the N2 gas may be heated by an independent inert gas heating means.

Figure 5:
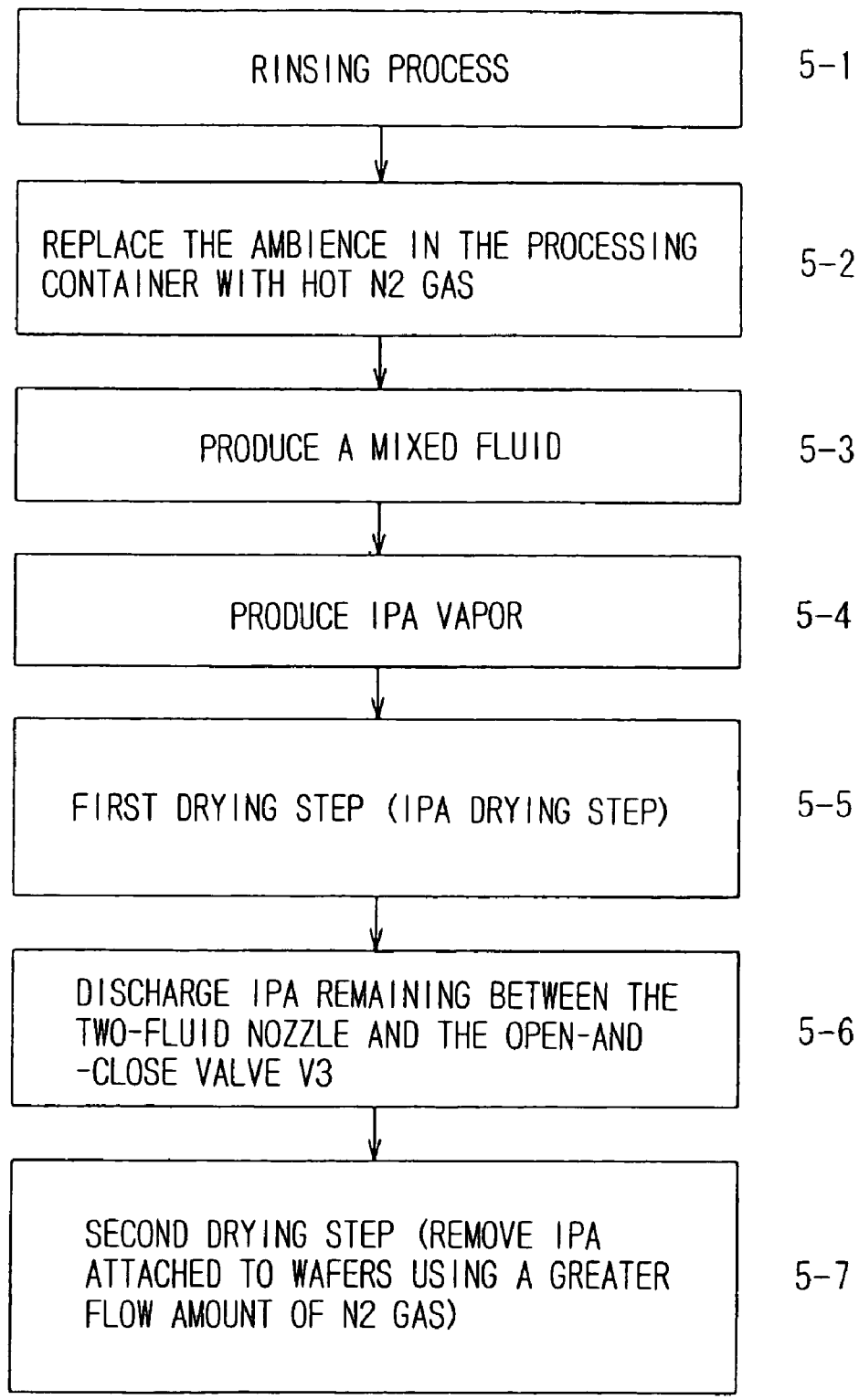
FIG. 5 is a flow chart showing operational mode of the vapor drying apparatus.

Next, an operational mode of the vapor drying apparatus will be described with reference to FIG. 1 and a flow chart shown in FIG. 5. First, N2 gas is filled in the N2 gas supply line 23 from the N2 gas supply source 5 by opening the open-and-close valve V1. In this state, IPA is supplied to the IPA tank 4 from the IPA supply source 8 by opening the open-and-close valve V0 to store IPA therein.

Subsequently, wafers W are placed in the processing container 1 to perform a rinsing process (Step 5-1). Thereafter, the halogen lamps 13 of the vapor generating apparatus 10 are turned ON while the open-and-close valve V2 is opened, thus bringing approximately 100 liters of N2 gas flowing in the two-fluid nozzle 3 and a greater amount, for example, 200 liters, of N2 gas flowing in the branch line 25 to flow into the spiral tube 14 constituting each vapor generator 15 of the vaporizing unit 11 and the temperature rising unit 12 while heating the gas by light energy radiated from each halogen lamp 13, then supplying the heated hot N2 gas into the processing container 1 to replace the ambience in the processing container 1 with the heated hot N2 gas (Step 5-2). The open-and-close valve V2 is then closed to supply only the approximately 100 liters of N2 gas from the two-fluid nozzle 3.

Next, the open-and-close valve V3 provided on the IPA supply line 24 is opened while IPA is supplied to the two-fluid nozzle 3 by driving the IPA supply pumps PA, PB. In this case, the check sensor Sc monitors whether IPA is supplied in a proper amount. Once IPA is supplied in such a manner, IPA is mixed with N2 gas to produce a mixed fluid by means of the two-fluid nozzle 3 (Step 5-3), and the mixed fluid is then supplied to the vaporizing unit 11 of the vapor generating apparatus 10 through the mixed fluid supply line 22, so that the mixed fluid can be vaporized by the vapor generators 15 of the vaporizing unit 11 at a temperature higher than the boiling point of IPA (82.4° C.) but lower than the temperature for subjecting the vapor to the temperature rising step, for example, 83° C. Subsequently, the vaporized mixed fluid is supplied to the vapor generators 15 of the temperature rising unit 12, then similarly heated by the vapor generators 15 of the temperature rising unit 12 to a processing temperature, for example, 200° C. to produce solvent vapor (IPA vapor) (Step 5-4). In the procedure, the vaporizing temperature sensor 31b detects the vaporizing temperature in the vaporizing unit 11 while the temperature rising sensor 32c detects the temperature of the vaporized fluid, and the detected information is then transmitted to the CPU 40, so that the current regulation units 50A, 50B can be controlled by control signals from the CPU 40, and as such keeping the vaporizing temperature and the temperature for subjecting the vapor to the temperature rising step to appropriate temperatures, respectively.

Thereafter, the IPA vapor produced by the vapor generating apparatus 10 is supplied toward the wafers W in the processing container 1 from the supply nozzle 2 through the vapor supply line 21 to perform the IPA drying step of the wafers W (first drying step: Step 5-5).

Once the IPA drying step is performed, the driving of the IPA supply pumps PA, PB is stopped, followed by closing the open-and-close valve V3. Subsequently, the open-and-close valve V4 provided on the sub-branch line 27 is opened while the open-and-close valve V5 provided on the IPA drain line 80 is opened, so that IPA remaining between the two-fluid nozzle 3 and the open-and-close valve V3 in the IPA supply line 24 can be purged by N2 gas (Step 5-6). This can securely prevent the remaining IPA from being supplied into the processing container 1 upon starting a next drying step.

Next, the open-and-close valve V2 is opened again to flow N2 gas from both the branch line 25 and the two-fluid nozzle 3 in a greater amount (approximately 300 liters) to vaporize IPA attached to the wafers W and remove it therefrom by utilizing N2 gas (second drying step: Step 5-7).

Once the drying step by utilizing N2 gas is performed, the halogen lamps 13 of the vapor generating apparatus 10 are switched OFF while the open-and-close valve V1 is closed to end the process.

While, in the aforementioned embodiment, the case where the vapor drying apparatus according to the present invention is applied to a drying apparatus for wafers W using vapor of a mixed fluid of IPA and N2 gas has been described, this invention is also applicable to a drying apparatus for other objects to be processed than the wafers W, for example, LCD glass substrates.

Second Embodiment

Hereinafter, another example of the best mode of carrying out the present invention will be described in detail with reference to the accompanying drawings. In this case, a vapor drying apparatus according to the present invention which is applied to a washing and drying system for semiconductor wafers is described.

Figure 6:
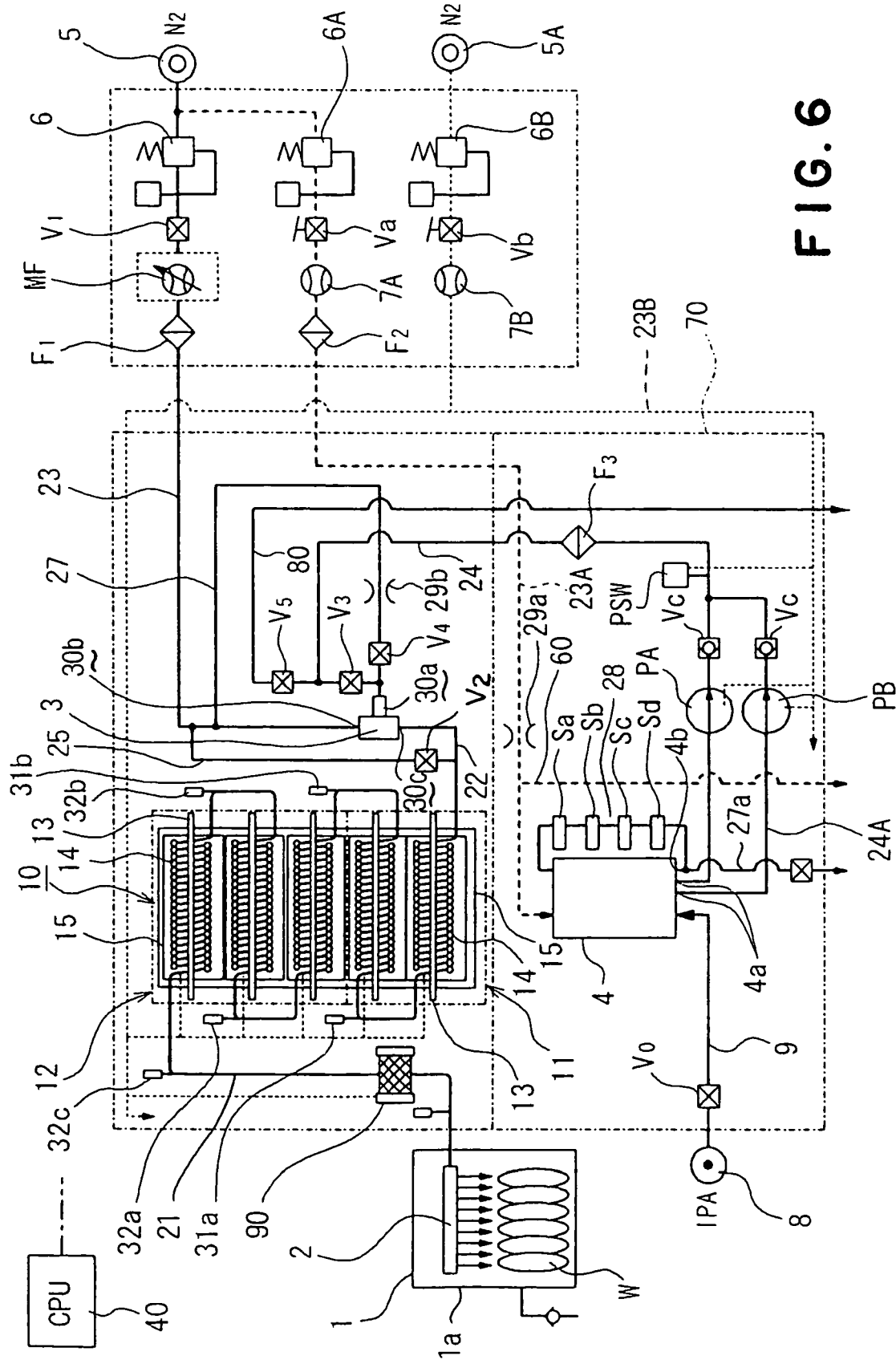
FIG. 6 is a schematic view showing a construction of a washing and drying system to which is applied a vapor generating apparatus according to a second embodiment of the present invention.
Figure 7:
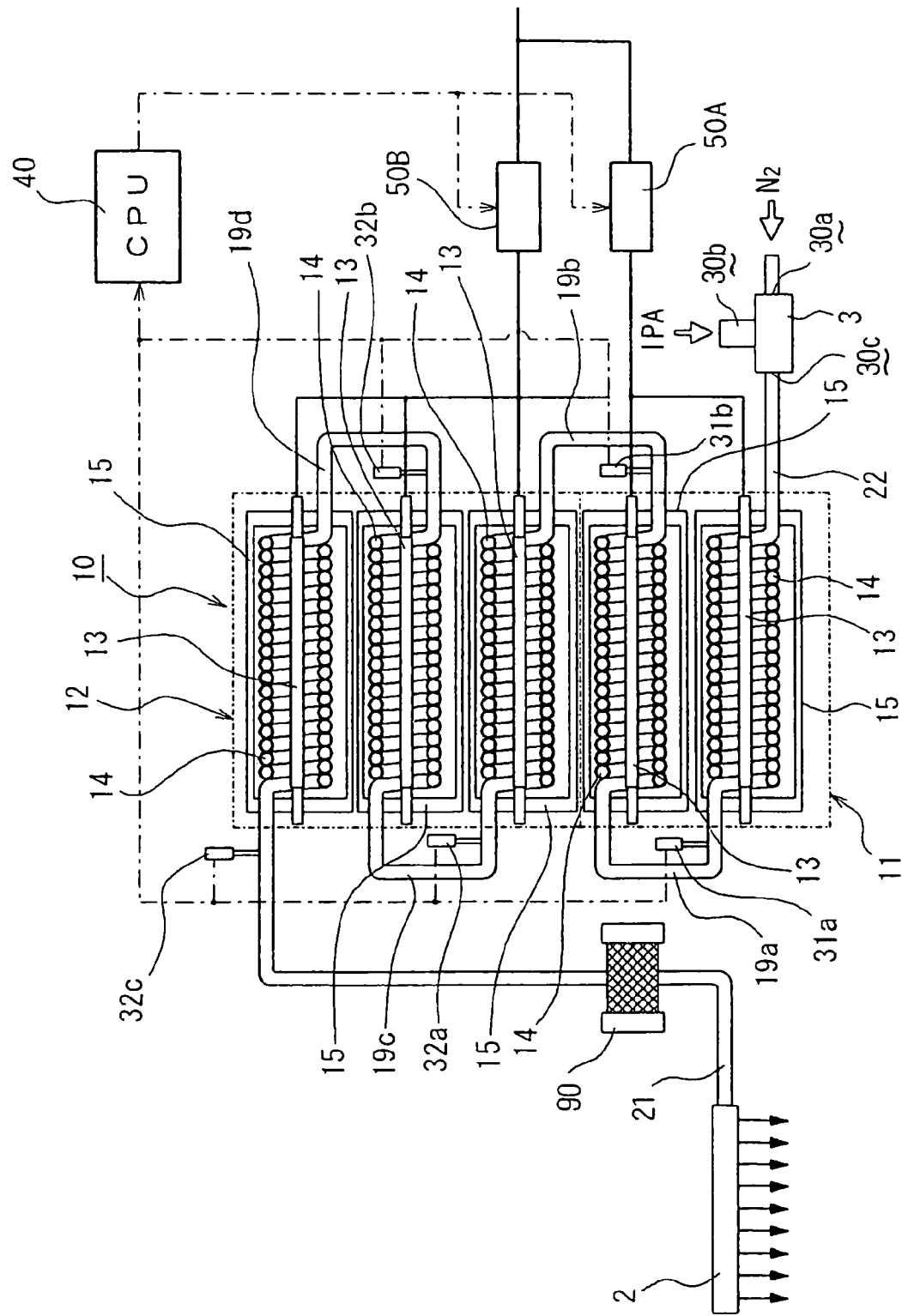
FIG. 7 is a schematic cross section showing a vapor generating apparatus according to the present invention.

FIG. 6 is a schematic view showing a construction of a washing and drying system, and FIG. 7 is a schematic cross section showing key portions of the system according to the present invention.

The washing and drying system comprises a processing container 1 having a processing chamber 1a for containing semiconductor wafers W (hereinafter referred to as wafers W) to be processed; a supply nozzle 2 as a vapor supply means for supplying (injecting) vapor used for drying toward the wafers W in the processing container 1; a vapor generating apparatus 10 according to the present invention, which is adapted to produce of a mixed fluid containing IPA (isopropyl alcohol) and N2 gas; a two-fluid nozzle 3 as a mixed fluid producing means for producing the mixed fluid containing IPA and N2 gas, i.e., a mixed fluid formed by mixing atomized IPA in N2 gas; a tank 4 (hereinafter referred to as IPA tank 4) connected to an IPA supply source and adapted to store an IPA liquid; an N2 gas supply source 5; a vapor supply line 21 for connecting the vapor supply nozzle 2, the vapor generating apparatus 10, the two-fluid nozzle 3, the IPA tank 4 and the N2 gas supply source 5; a mixed fluid supply line 22; an N2 gas supply line 23; and an IPA supply line 24.

The vapor generating apparatus 10, as shown in FIG. 7, is connected to an outlet 30c of the two-fluid nozzle 3 through the mixed fluid supply line 22, and includes a first heating unit 11 (hereinafter referred to as vaporizing unit 11) for vaporizing the mixed fluid of IPA and N2 gas produced by the two-fluid nozzle 3, and a second heating unit 12 (hereinafter referred to as temperature rising unit 12) for elevating the temperature of the vaporized fluid produced by the vaporizing unit 11 to a predetermined processing temperature (e.g., 150 to 200° C.).

Also, the vapor generating apparatus 10 includes a first temperature detecting means 31b (hereinafter referred to as vaporizing temperature detecting means 31b), as described below, for detecting the temperature of the mixed fluid vaporized by the vaporizing unit 11; a second temperature detecting means 32c (hereinafter referred to as temperature rising detecting means 32c), as described below, for detecting the temperature of the vapor subjected to the temperature rising step by the temperature rising unit 12; and a control means (hereinafter referred to as CPU 40) which is adapted to control the heating temperature of the heating means constituting the vaporizing unit 11, i.e., the electric current of each halogen lamp 13, as described below, based on the temperature to be detected by the vaporizing temperature detecting means 31b as well as to control the heating temperature of the heating means constituting the temperature rising unit 12, i.e., the electric current of each halogen lamp 13, as described below, based on the temperature to be detected by the temperature rising detecting means 32c.

In this case, the vaporizing unit 11 includes two vapor generators 15, while the temperature rising unit 12 includes three vapor generators 15. It should be noted that the number of the vapor generators 15 in the vaporizing unit 11 and the temperature rising unit 12 is not limited to the numbers described above.

Each vapor generator 15 utilizes light energy as the heat source and is configured to convert the light energy into heat energy and then transmit the heat indirectly to the mixed fluid. Namely, each vapor generator 15, as shown in FIG. 4, includes a container body 17 made of stainless steel for example in a form of a sealed tube with a heat insulating material fixed to the inner wall thereof; the halogen lamp 13 as a heating means arranged along the central axis of the container body 17; and a spiral tube 14 in a helical form which surrounds the halogen lamp 13 with a gap defined between the lamp 13 and the tube 14, with each turn of the spiral tube 14 abutting to adjacent ones. One end of the spiral tube 14 provides a fluid inlet 14a extending through a side wall of one end of the container body 17 while the other end of the spiral tube 14 provides a fluid outlet 14b extending through a side wall of the other of the spiral tube 14 end of the container body 17. The spiral tube 14 is formed of a pipe member made of stainless steel, with the surface coated with a black color paint 18 (see FIGS. 8(a), (b)) for absorbing radiant light. As such, by coating the surface of the spiral tube 14 with a black color paint 18 for absorbing radiant light, the light radiated from the halogen lamp 13 will be absorbed by the black color paint 18, converted into heat energy, and then transmitted, uniformly with high efficiency, to the fluid flowing in the spiral tube 14 indirectly therethrough.

Additionally, to the side wall of the one end of the container body 17 is provided an N2 gas supply opening 17a. By supplying N2 gas supplied from the N2 gas supply source 5A as described below into the container body 17, invasion of the ambient gas, for example, the ambient IPA into the container body 17 can be prevented by continuing the supply of N2 gas into the container body 17, and thus enhancing the safety of the vapor generators 15.

According to each vapor generator 15 configured as described above, the mixed fluid, produced by mixing atomized IPA in N2 gas, flowing from the inlet 14a to the outlet 14b can be heated indirectly via the black color paint 18 for absorbing light energy to be radiated from the halogen lamp 13 and the spiral tube 14. In this case, the mixed fluid is vaporized in the vaporizing unit 11, and the vaporized mixed fluid is then heated to a predetermined temperature in the temperature rising unit 12.

The inlet 14a of the vapor generator 15 placed on the upstream side among the two vapor generators 15 constituting the vaporizing unit 11 is connected to the two-fluid nozzle 3 through the mixed fluid supply line 22 while the outlet 14b being connected to the inlet 14a of the vapor generator 15 placed on the downstream side through a first connecting line 19a.

The outlet 14b of the vapor generator 15 placed on the downstream side of the vaporizing unit 11 is connected to the inlet 14a of the vapor generator 15 placed on the upstream side of the temperature rising unit 12 through a second connecting line 19b, and the outlet 14b of the vapor generator 15 placed on the upstream side of the temperature rising unit 12 is connected to the inlet 14a of the vapor generator 15 placed in a middle portion through a third connecting line 19c, and the outlet 14b of the middle vapor generator 15 is connected to the inlet 14a of the vapor generator 15 placed on the downstream side of the temperature rising unit 12 through a fourth connecting line 19d.

Also in the vapor generating apparatus 10 a vaporizing temperature sensor 31b is provided, on the second connecting line 19b, as the vaporizing temperature detecting means for detecting the temperature of the fluid to be vaporized by the vapor generators 15 in the vaporizing unit 11.

On the side of vapor generators 15 of the vapor supply line 21 connected to the outlet 14b of the downstream vapor generator 15 in the temperature rising unit 12, a temperature rising sensor 32c is provided as the temperature rising detecting means for detecting the temperature of the vapor to be subjected to the temperature rising step by the vapor generators 15.

In addition, on the first connecting line 19a, third connecting line 19c and fourth connecting line 19d, monitoring temperature sensors 31a, 32a and 32b are provided, respectively.

The vaporizing temperature sensor 31b and the temperature rising sensor 32c are electrically connected to the CPU such that temperature information detected can be transmitted to the CPU 40, respectively. By actuation of current regulation units 50A, 50B connected to the halogen lamp 13 of each vapor generator 15 based on a control signal from the CPU 40, the temperatures in the vaporizing step and the temperature rising step can be controlled, respectively. Namely, the temperature information on the vaporizing unit 11 to be detected by the vaporizing temperature sensor 31b is transmitted to the current regulation unit 50A from the CPU 40 so as to control each halogen lamp 13 in the vaporizing unit 11. In addition, the temperature information on the temperature rising unit 12 to be detected by the temperature rising sensor 32c is transmitted to the current regulation unit 50B from the CPU 40 so as to control each halogen lamp 13 in the temperature rising unit 12. In this case, the halogen lamp 13 of each vapor generator 15 in the vaporizing unit 11 is set at a temperature slightly higher than the boiling point of IPA (82.4° C.), for example, the boiling point of IPA +20° C. or less, preferably the boiling point +10° C. or less. The halogen lamp 13 of each vapor generator 15 in the temperature rising unit 12 is set such that the temperature of the produced vapor can be elevated to a predetermined processing temperature (150 to 200° C.). Each temperature information to be detected by the monitoring temperature sensors 31a, 32a, 32b is transmitted to the CPU 40, and displayed on a monitoring device (not shown) based on a control signal from the CPU 40, thus enabling to monitor the state of vapor in the vapor generating apparatus 10.

The CPU 40 includes a computer readable storage medium (recording medium) in which is stored a software for operating the computer to perform a control program. Based on the program, when it is used, the computer is designed to control the vapor drying apparatus 10 such that a vaporizing step to substantially vaporize a fluid containing IPA liquid and then a temperature rising step to elevate the temperature of the vaporized fluid to a predetermined temperature are performed.

To the vapor supply line 21 is provided a metal filter 90 equipped with a heater such that impurities contained in the vapor to be processed can be removed by the metal filter 90.

The nozzle two-fluid 3 is configured to change liquid IPA into an atomized state utilizing a flow speed of N2 gas and supply the mixed gas to the vapor generating apparatus 10. An N2 gas supply opening 30b of the two-fluid nozzle 3 is connected to the N2 gas supply source 5 through the N2 gas supply line 23. On the N2 gas supply line 23, a pressure reducing valve 6, an open-and-close valve V1, a mass flow controller MF and a filter F1 are arranged in succession from the side of the N2 gas supply source 5. The N2 gas supply line 23 and the mixed fluid supply line 22 are connected through a branch line 25. On the branch line 25, an open-and-close valve V2 is provided in parallel with the two-fluid nozzle 3.

In this way, the connection of the N2 gas supply line 23 and the mixed fluid supply line 22 through the branch line 25 as well as the provision of the open-and-close valve V2 in parallel with the two-fluid nozzle 3 on the branch line 25 enables to supply a mixed fluid of IPA and N2 gas from the two-fluid nozzle 3 by closing the open-and-close valve V2 upon the IPA drying step. However, upon the drying step using only the N2 gas, it is possible to supply only the N2 gas from the two-fluid nozzle 3 while supplying N2 gas from the branch line 25 by opening the open-and-close valve V2, thus achieving to flow N2 gas in a greater amount. Accordingly the N2 gas drying step can be performed with high efficiency.

The IPA supply opening 30a of the two-fluid nozzle 3 is connected to an outlet 4a provided at the bottom portion of the IPA tank 4 through the IPA supply line 24. In this case, two outlets 4a are provided, and the IPA supply line 24 is connected to one of the outlets 4a, while an IPA supply branch line 24A which is connected to the other outlet 4a is also connected to a middle portion of the IPA supply line 24. Reciprocating IPA pumps PA, PB are provided in parallel on the IPA supply line 24 and the IPA supply branch line 24A, respectively. On the downstream side (discharging side) of the IPA supply pumps PA, PB of the IPA supply line 24 and the IPA supply branch line 24A, check valves Vc are provided, respectively. In addition, on the downstream side of the connection point of the IPA supply line 24 to the IPA supply branch line 24A, a pressure switch PSW and a filter F3 are provided. Both the IPA supply pumps PA, PB and the pressure switch PSW are electrically connected to the CPU 40 and configured to operate with a phase difference (retardation) relative to each other based on a control signal from the CPU 40. Such actuation of both the IPA supply pumps PA, PB with a phase difference enables to restrain pulsation upon the IPA supply as well as to precisely control the supply amount of IPA. In this case, the flow amount is identified by monitoring the pressure of the IPA supply pumps PA, PB using the pressure switch PSW.

A pipe line 28 for measuring the amount of IPA is connected to a top end of the IPA tank 4 as well as connected to a tank drain line 27a which is connected to the drain opening 4b provided at a bottom portion of the IPA tank 4. On the measuring line 28, an upper limit sensor Sa for detecting an upper limit amount of IPA in the IPA tank 4, a proper quantity sensor Sb for detecting a proper quantity of IPA, a check sensor Sc for checking operation of the IPA supply pumps PA, PB, and a lower limit sensor Sd for detecting a lower limit amount of IPA are provided in succession from the upper. These sensors Sa to Sd are electrically connected to the CPU 40 and transmit signals detected thereby to the CPU 40, respectively, such that actuation and discontinuation of the IPA supply pumps PA, PB, opening and closing of an open-and-close valve V0 provided on a supply line 9 connecting the IPA supply source 8 and the IPA tank 4 can be performed based on the control signals from the CPU 40. In this case, a sequence for calculating and identifying the time from start of discharging IPA to its predetermined passage point is incorporated in the check sensor Sc.

An overflow line 60 is connected to the top end of the IPA tank 4, and an N2 gas branch supply line 23A branched from the N2 gas supply source 5 of the N2 gas supply line 23 is connected to a middle portion of the overflow line 60. On the N2 gas branch supply line 23A, a pressure reducing valve 6A, a manual open-and-close valve Va, an orifice 7A and a filter F2 are arranged in succession from the side of the N2 gas supply source 5, and an orifice 29a is provided on the upstream side of the connecting portion to the overflow line 60.

In such a construction, since N2 gas can be supplied continuously through the overflow line 60 into the IPA tank 4, invasion of contaminated gas into the IPA tank 4 from the overflow line 60 upon discharging IPA from the IPA tank 4 can be prevented. Additionally, the supply of N2 gas to a middle portion of the overflow line 60 also solves the following problems. If N2 gas is supplied directly into the IPA tank 4, this would lower the ambient concentration of IPA in the space above the surface of IPA in the IPA tank 4, facilitating volatilization thus leading to waste of IPA. On the other hand, the supply of N2 gas to a middle portion of the overflow line 60 can effectively control indirect application of N2 gas to the IPA tank 4, thus solving the above problem.

The open-and-close valve V3 is provided to the IPA supply line 24 in the vicinity of the IPA supply opening 30a of the two-fluid nozzle 3, and a second N2 gas branch line (sub-branch line) 27 branched from the N2 gas supply line 23 is connected between the open-and-close valve V3 and the two-fluid nozzle 3 on the IPA supply line 24. On the second N2 gas branch line 27, an open-and-close valve V4 and an orifice 29 are provided in succession from the side of the two-fluid nozzle 3.

In this way, by connecting the second N2 branch line 27 branched from the N2 gas supply line 23 between the open-and-close valve V3 and the two-fluid nozzle 3 on the IPA supply line 24, after finishing the supply of IPA using the IPA supply pumps PA, PB, the IPA remaining in the IPA supply line 24 up to the two-fluid nozzle 3 can be displaced to the two-fluid nozzle 3 using N2 gas, thus IPA will no longer remain in the IPA supply line 24. Accordingly, the possibility that IPA would be supplied upon the N2 drying step can be eliminated.

In the vicinity of the upstream side of open-and-close valve V3 on the IPA supply line 24, an IPA drain line 80 is connected through an open-and-close valve V5. In this case, in place of the open-and-close valve V5, a safety valve may be provided on the IPA drain line 80.

The vapor generating apparatus 10, two-fluid nozzle 3, IPA tank 4, IPA supply pumps PA, PB including the piping for these components are disposed in a clean room 70 isolated from the open air, the clean room 70 being configured such that purified N2 gas is supplied therein through an N2 gas supply line 23B connected to an N2 gas supply source 5A (see FIG. 6). On the N2 gas supply line 23B, a pressure reducing valve 6B, a manual open-and-close valve Vb and an orifice 7B are arranged in succession from the side of the N2 gas supply source 5A.

Again, the components, such as the open-and-close valves V0, V1 to V5 and mass flow controller MF are in electrical communication with the CPU 40 and configured to operate based on signals transmitted from the CPU 40, respectively.

Next, an operational mode of the vapor processing apparatus will now be described. First, N2 gas is filled in the N2 gas supply line 23 from the N2 gas supply source 5 by opening the open-and-close valve V1. In this state, IPA is supplied to the IPA tank 4 from the IPA supply source 8 by opening the open-and-close valve V0 to store IPA therein.

Subsequently, wafers W are placed in the processing container 1 to perform a rinsing process. Thereafter, the halogen lamps 13 of the vapor generating apparatus 10 are turned ON while the open-and-close valve V2 is opened, thus bringing approximately 100 liters of N2 gas flowing in the two-fluid nozzle 3 as well as a greater amount, for example, 200 liters, of N2 gas flowing in the branch line 25 to flow into the spiral tube 14 constituting each vapor generator 15 of the vaporizing unit 11 and the temperature rising unit 12 while heating the gas by light energy emanated from each halogen lamp 13, then supplying the heated N2 gas into the processing container 1 to replace the ambience in the processing container 1 with the heated N2 gas. The open-and-close valve V2 is then closed to supply only the approximately 100 liters of N2 gas from the two-fluid nozzle 3.

Thereafter, the open-and-close valve V3 provided to the IPA supply line 24 is opened while supplying IPA to the two-fluid nozzle 3 by actuating the IPA supply pumps PA, PB. In this case, whether IPA is supplied in a suitable amount is monitored by the check sensor Sc. Once IPA is supplied in such a manner, IPA is mixed with N2 gas to produce a mixed fluid by means of the two-fluid nozzle 3, and the mixed fluid is then supplied to the vaporizing unit 11 of the vapor generating apparatus 10 through the mixed fluid supply line 22, so that the mixed fluid can be vaporized by the vapor generators 15 of the vaporizing unit 11 at a temperature higher than the boiling point of IPA (82.4° C.) but lower than the temperature for subjecting the vapor to the temperature rising step, for example, 83° C. Subsequently, the vaporized mixed fluid is supplied to the vapor generators 15 of the temperature rising unit 12, then similarly heated by the vapor generators 15 of the temperature rising unit 12 to a processing temperature, for example, 200° C. In this state, the vaporizing temperature sensor 31b detects the vaporizing temperature in the vaporizing unit 11 and the temperature rising sensor 32c detects the temperature of the vaporized fluid, and the detected information is then transmitted to the CPU 40, so that the current regulation units 50A, 50B can be controlled by control signals from the CPU 40, and thereby keeping the vaporizing temperature and the temperature for subjecting the vapor to the temperature rising step to appropriate temperatures, respectively.

Thereafter, the vapor produced by the vapor generating apparatus 10 is supplied toward the wafers W placed in the processing container 1 from the supply nozzle 2 through the vapor supply line 21 to carry out the IPA drying step of the wafers W.

After the IPA drying step is carried out, the actuation of the IPA supply pumps PA, PB is stopped, followed by closing the open-and-close valve V3. Subsequently, the open-and-close valve V4 provided on the second N2 gas supply branch line 27 is opened while the open-and-close valve V5 provided on the IPA drain line 80 is opened, so that IPA remaining between the two-fluid nozzle 3 and the open-and-close valve V3 in the IPA supply line 24 can be purged by N2 gas. This can securely prevent the remaining IPA from being supplied into the processing container 1 upon starting a next drying step.

Next, the open-and-close valve V2 is opened again to flow N2 gas from both the branch line 25 and the two-fluid nozzle 3 in a greater amount (approximately 300 liters) to reduce IPA attached to the wafers W by utilizing N2 gas.

Once the drying step by N2 gas is performed, the halogen lamps 13 of the vapor generating apparatus 10 are switched OFF while the open-and-close valve V1 is closed to end the process.

While, in the aforementioned embodiment, the case where the vapor producing apparatus or vapor processing apparatus according to the present invention are applied to a drying apparatus for wafers W using vapor of a mixed fluid of IPA and N2 gas has been described, this invention is also applicable to a drying apparatus for other objects to be processed than the wafers W, for example, LCD glass substrates. In addition, this invention can also be applied to a vapor producing apparatus or vapor processing apparatus using other mixed fluids containing other components than IPA and N2 gas.

The invention claimed is:

1. A vapor generating apparatus for generating a vaporized fluid and supplying the same to a washing and drying chamber, comprising:
   a supply line;
   a first heating unit which heats and substantially vaporizes a fluid containing a liquid in the supply line to generate a vaporized fluid; and
   a second heating unit, which is positioned downstream with respect to vaporized fluid travel from the first heating unit, and which heats the vaporized fluid in the supply line and elevates the temperature of the fluid to a predetermined temperature, and the supply line supplies the vaporized fluid heated by the second heating unit to the washing and drying chamber positioned downstream, with respect to vaporized fluid travel within the supply line, of said second heating unit, and
   wherein, in the first heating unit, the fluid containing the liquid is heated to a temperature above the boiling point of the liquid.

2. The vapor generating apparatus according to claim 1, further comprising:
   a first temperature detecting means adapted to detect the temperature of the fluid vaporized by the first heating unit;
   a second temperature detecting means adapted to detect the temperature of the vapor elevated by the second heating unit; and
   a control means adapted to control the heating temperature of the first heating unit based on the temperature detected by the first temperature detecting means as well as to control the heating temperature of the second heating unit based on the temperature detected by the second temperature detecting means.

* * * * *